United States Patent
Evans

(10) Patent No.: US 12,267,974 B2
(45) Date of Patent: Apr. 1, 2025

(54) ELECTRONICS UNIT

(71) Applicant: MBDA UK LIMITED, Stevenage (GB)

(72) Inventor: Michael Evans, Stevenage (GB)

(73) Assignee: MBDA UK LIMITED, Stevenage (GB)

(*) Notice: Subject to any disclaimer, the term of this patent is extended or adjusted under 35 U.S.C. 154(b) by 0 days.

(21) Appl. No.: 18/286,459

(22) PCT Filed: Apr. 27, 2022

(86) PCT No.: PCT/GB2022/051070
§ 371 (c)(1),
(2) Date: Oct. 11, 2023

(87) PCT Pub. No.: WO2022/229636
PCT Pub. Date: Nov. 3, 2022

(65) Prior Publication Data
US 2024/0196556 A1    Jun. 13, 2024

(30) Foreign Application Priority Data

Apr. 29, 2021 (EP) .................................. 21275048
Apr. 29, 2021 (GB) .................................. 2106096

(51) Int. Cl.
*G06F 1/16* (2006.01)
*F42B 15/34* (2006.01)
(Continued)

(52) U.S. Cl.
CPC ............ *H05K 5/064* (2013.01); *F42B 15/34* (2013.01); *H05K 5/069* (2013.01); *H05K 7/1434* (2013.01)

(58) Field of Classification Search
CPC ........ H05K 5/064; H05K 5/065; H05K 5/069; H05K 5/06; H05K 7/1434; H05K 7/1427; H05K 7/1422; F42B 15/34; F42B 15/00
See application file for complete search history.

(56) References Cited

U.S. PATENT DOCUMENTS 3,267,854 A * 8/1966 Michelson ............. F42B 15/00
                                                    89/1.819
3,727,553 A * 4/1973 Godfrey ............... H05K 7/1434
                                                    250/342

(Continued)

FOREIGN PATENT DOCUMENTS

GB         2585442 A      1/2021

OTHER PUBLICATIONS

International Search Report and Written Opinion dated Oct. 18, 2022 issued in PCT/GB2022/051070.

(Continued)

*Primary Examiner* — Anthony M Haughton
(74) *Attorney, Agent, or Firm* — Scully, Scott, Murphy & Presser, P.C.

(57) ABSTRACT

An electronic unit for a missile comprising a potted electronics in a housing: the unit being adapted to compensate for a difference in coefficient of thermal expansion between the potted electronics and the housing, the unit further comprising: a first ramp; and a second ramp slidably arranged against the first ramp, wherein the first and second ramps are disposed within the housing, the first or the second ramp abutting the potted electronics so as to provide an interference fit between the potted electronics and the housing; wherein the first ramp and second ramp each comprise a coefficient of thermal expansion selected to maintain the interference fit between the potted electronics and the housing throughout a temperature range.

16 Claims, 3 Drawing Sheets

(51) Int. Cl.
   *H05K 5/00*  (2006.01)
   *H05K 5/06*  (2006.01)
   *H05K 7/00*  (2006.01)
   *H05K 7/14*  (2006.01)

(56) References Cited

U.S. PATENT DOCUMENTS

| | | | |
|---|---|---|---|
| 4,891,688 A | 1/1990 | Longerich | |
| 5,060,115 A | 10/1991 | Sewell | |
| 5,218,517 A * | 6/1993 | Sewell | H05K 7/1434 |
| | | | 174/16.3 |
| 5,706,180 A | 1/1998 | Lacroix et al. | |
| 6,094,906 A * | 8/2000 | Singer | F42B 39/20 |
| | | | 60/253 |
| 6,119,573 A * | 9/2000 | Berens | B64G 1/50 |
| | | | 89/1.816 |
| 12,000,684 B2 * | 6/2024 | Hayes | F42B 15/34 |
| 2003/0079464 A1 * | 5/2003 | Solberg | F42B 15/00 |
| | | | 60/253 |
| 2003/0169578 A1 * | 9/2003 | Blazic | H05K 7/1434 |
| | | | 361/796 |
| 2010/0046177 A1 * | 2/2010 | Rapp | H05K 7/1434 |
| | | | 361/752 |
| 2018/0216898 A1 * | 8/2018 | Ockfen | F42B 15/34 |
| 2019/0178904 A1 | 6/2019 | Braman et al. | |

OTHER PUBLICATIONS

GB Search Report dated Oct. 20, 2021 issued in GB 2106096.7.
Extended European Search Report dated Oct. 19, 2021 issued in EP 21275048.3.

* cited by examiner

Hot State

Cold State

ELECTRONICS UNIT

FIELD

This invention relates to an electronics unit, in particular, an electronics unit for a missile.

BACKGROUND

Missiles contain electronics units which may comprise fragile components. Missiles also tend to operate in extreme temperature ranges and may change temperature rapidly during use. Within an electronics unit, electronics are commonly 'potted' in a potting compound to protect the fragile components from shock forces and rapid temperature changes. Said potted electronics are retained within a housing. The housing may be fabricated from a material having a different coefficient of thermal expansion to that of the potting compound. When subject to changing temperatures, therefore, the housing of the electronics may expand at a different rate compared to the potted electronics. This may yield temperature induced gaps between the potted electronics and the housing, or alternatively result in compression of the potted electronics. During operational use, the missile may be subject to vibration on an aircraft weapon pylon; or to high acceleration events such as launch or target impact. Any gaps may allow the potted electronics to vibrate or move within the housing and this movement may destroy or damage the electronics, consequently impairing the function of the missile.

It is an example aim of the present invention to solve or avoid such problems associated with temperature induced movement in potted electronics in missiles.

SUMMARY OF INVENTION

According to a first aspect of the invention, there is provided an electronics unit for a missile comprising a potted electronics in a housing, the unit being adapted to compensate for a difference in coefficient of thermal expansion between the potted electronics and the housing; the unit comprising a ramp arrangement disposed within the housing, and the unit having an axis in the direction from the potted electronics to the ramp arrangement; the ramp arrangement comprising a first ramp, and a second ramp slidably arranged against the first ramp at a ramp interface, which ramp interface is angled relative to the axis; the first and second ramps being formed of different materials having different coefficients of thermal expansion; wherein the ramp arrangement abuts the potted electronics so as to provide an interference fit between the potted electronics and the housing, and is at least partially bounded by the housing such that, when the temperature changes and the different materials expand or contract by different amounts, the first and second ramps are constrained to move axially relative to one another within the housing so as to maintain the interference fit between the potted electronics and the housing.

During high acceleration events such as impact of the missile onto a target (which may yield forces in excess of 100,000 G), the electronics unit may still be required to function to enable correct operation of the missile, for example where delayed fuse initiation is used for armour piercing or bunker busting weapons.

Potting electronics reduces the chance of shear forces acting on the individual electronic components. Shear forces may sever or damage connections between components, for example solder joints between printed circuit boards. Such potting compounds may be semi rigid or gelatinous. The potting compound may be selected from a group comprising thermosetting plastics, silicone rubber gels or epoxy based resins. Preferably the electronics are set in an epoxy resin. More preferably, the electronics are set in Eccobond™ 45 provided by Henkel®.

The potted electronics are retained within the housing. Said housing may be a walled structure arranged to protect the potted electronics. The housing may be of any suitable shape to retain the potted electronics. Preferably, the housing is in the form of a generally cylindrical container comprising a side wall and two end faces accommodating the potted electronics. Of course, the housing may have other geometries or shapes so as to fit within the general construction of the missile. For example, the housing may have a square, rectangular, circular or irregular cross section. The housing may be made from metal, metal alloys, metalloids or other non-metal high strength materials. The housing may be made from the same material as the body of a missile in which the unit is placed. Preferably, the housing comprises a low density in order to minimise inertial forces of the housing during high acceleration events. Preferably the housing is made from a low density metal such as aluminium. More preferably, the housing is made from aluminium 2014A.

There may be a mismatch between the coefficients of thermal expansion (CTEs) of the housing and the potted electronics. Temperature changes during operational use of the missile, commonly in the range from −50° C. to +100° C., may, as a result, create temperature induced gaps between the potted electronics and the housing. Such gaps have the potential to prevent the missile functioning as intended as the potted electronics may begin to vibrate and move freely within the temperature induced gap within the housing. This movement may be extremely amplified during a high acceleration event, and may result in damage or destruction of the potted electronics. Conversely, in cold temperatures, the housing may contract faster than the potted electronics thereby stressing the potted electronics. Such stresses may also damage the electronic components within the potted electronics.

Advantageously, the present inventors have found that the provision of the ramp arrangement, disposed within the housing can be used to compensate for the mismatch in CTE between the housing and the potted electronics. Therefore, the provision of the ramp arrangement may increase the probability that the missile will function correctly in operational use throughout a temperature range.

In the present invention, the first ramp and second ramp are disposed within the housing and are slidably arranged against each other wherein the first or second ramp is abutted against the potted electronics to create an interference fit between the potted electronics and the housing. Preferably, the interface between the first and second ramp is at an angle in the range of from 30 to 60° relative to the axis. More preferably the interface is at an angle of 45° relative to the axis; in other words, both the first and second ramp mate on a 45° interface. In some examples the axis may align with the roll axis of the missile.

The coefficients of thermal expansion of the first and second ramp are selected to maintain the interference fit between the potted electronics and the housing throughout a temperature range. The temperature range may be that to which it is expected the electronics unit may be exposed during use. The coefficients of thermal expansion may be selected according to the specific needs of the electronics unit taking into account, for example, the material selection of the potting compound and housing.

The materials of the first and second ramps may be selected such that, when the temperature changes by an expected amount, the relative movement of the first and second ramps is substantially equal in magnitude, and opposite in direction, to a change in the axial length of the potted electronics in the housing, thereby maintaining the interference fit between the potted electronics and the housing.

The expected maximum and minimum axial length of a temperature induced gap over an expected temperature range may be calculated based upon the materials used. Alternatively, the maximum and minimum axial lengths may be determined by other means, for example empirically. Once this value has been determined, the material of the first and second ramp can be selected so that the difference in their respective coefficients of thermal expansion is such that first and second ramp may effectively 'absorb' the change between the maximum and minimum axial lengths by expansion or contraction across the expected temperature range.

The second ramp may be made from any material which does not comprise a coefficient of thermal expansion exactly of the same value as the first ramp.

The electronics unit will now be explained with reference to a change in temperature arising during operational use of the missile.

The housing comprises a first ramp slidably arranged against a second ramp and a potted electronics component wherein the first and second ramp cause the potted electronics component to be in an interference fit with the housing.

As the electronics unit cools from a relatively hot state, the housing contracts less than the potted electronics due to the housing comprising a lower coefficient of thermal expansion. This may create a temperature induced gap between the walls of the housing and the potted electronics. However, the first and second ramps contract at different rates due to the difference in their coefficients of thermal expansion. As the first and second ramps are at least partially bounded by the housing, their relative movement is constrained, and the difference in rate of contraction forces the first ramp to ride up the second ramp. The axial length inhabited by the first and second ramp arrangement is thereby increased. This increase in axial length compensates for the temperature induced gap that would otherwise be created by the differential contraction of the housing and the potted electronics.

Conversely, as the electronics unit heats from a relatively cold state, the housing expands less than the potted electronics. In addition, the first and second ramps expand by different amounts due to a difference in their relative coefficients of thermal expansion. As a result, the first ramp slides down the second ramp, reducing the axial length inhabited by the first and second ramp arrangement and compensating for the different amounts by which the housing and potted electronics expand.

In some examples the housing may completely bound the ramp arrangement, except for where the ramp arrangement abuts the potted electronics. As will be appreciated, the housing bounds the ramp arrangement sufficiently to constrain the relative movement of the first and second ramps to be axial relative to one another within the housing and so as to maintain the interference fit between the potted electronics and the housing.

Where the interface between the first and second ramp defines an angle to the missile roll axis, the present inventors have found advantageously that said interface may be configured to translate shocks along a longitudinal axis of the missile through the angle into the housing thereby isolating the potted electronics. The present inventors have found that that the provision of a ramp arrangement in addition to compensating for temperature induced gaps may also aid in translating shock forces which enter the missile. Such shock forces may enter the missile from the first point of impact, i.e. the tip of the missile along the axis of the missile before being translated through an angle defined by the interface of the first and second ramp such as to create a lateral component of the force vector into the housing thereby preventing the total shock force from being transmitted directly into the potted electronics. For example, where the interface between the first and second ramp is 45°, incoming shock forces along the axis of the missile are translated 90° into the housing i.e. the axial force vector is converted nearly wholly into a lateral force vector thereby avoiding the potted electronics. It will be appreciated that a similar effect will occur for any angle of the interface to the roll axis of the missile, for example an angle in the range from 30 to 60° relative to the axis, or more preferably an angle of 45°.

The present inventors believe this feature actively protects the potted electronics from damage during high acceleration events.

In one arrangement, the first ramp is a toroid and the second ramp is cone shaped. In this arrangement, the unit may be further arranged such that the first and second ramp are concentrically arranged such that the toroid is slidably mounted on the cone.

The operational temperature range wherein the electronic unit functions may be in the range of from −60° C. to 100° C.

Optionally, at least one of the first or second ramps is integral to the housing. For example, the second ramp may take the form of a cone shaped protrusion on one axial face of the housing. This may be advantageous in reducing the manufacturing and assembly complexity of the electronics unit and may further eliminate any further sources of temperature induced gaps within the housing.

Optionally, the first or second ramp angle profile may be tailored to ensure abutment of the first or second ramp to the potted electronics throughout the temperature range. For example, the ramp angle profile may be linear or non-linear. Where the ramp angle profile is linear, i.e. there is a constant angle difference between the first and second ramp e.g. 45°, the axial length of the ramp arrangement will change linearly with the differing expansion of the first and second ramps. Conversely, where the ramp angle profile is non-linear, i.e. the profile between the first and second ramp appears as a curve or waveform or anything other than a constant angle, the axial length of the ramp arrangement will change non-linearly with the differing expansion of the first and second ramps. A non-linear ramp angle profile may be advantageous where sudden temperature changes require the ramp arrangement to change axial length quickly, i.e. the gradient of the ramp will be steep. It may also be advantageous to have shallow gradient portions on the ramp angle profile in order for the ramp arrangement to temporarily change axial length slowly. Preferably, the ramp angle profile is linear.

The electronics unit may further comprise a compressible membrane arranged between the first or second ramp and the potted electronics. The compressible membrane may further aide in the isolation of the potted electronics within the housing. For example, the electronics may be assembled under an interference fit with the housing wherein a compressible membrane is provided between the potted electronics and the housing in order to eliminate extremely small tolerance gaps created during manufacture. Furthermore, the compressible membrane may further be arranged to cocoon or envelop the potted electronics, i.e. surrounding it on all sides within the housing. The compressible membrane may be made from an elastomer. Preferably the compressible membrane is made from rubber.

In one arrangement, the first ramp may comprise a coefficient of thermal expansion in the range of from 75 to $130 \times 10^{-6}$ m/mK, or preferably in the range of from 110 to $125 \times 10^{-6}$ m/mK.

In one arrangement, the second ramp may comprise a coefficient of thermal expansion in the range of from 10 to $30 \times 10^{-6}$ m/mK, or preferably in the range of from 20 to $25 \times 10^{-6}$ m/mK.

There may be a provided a plurality of ramp arrangements within the electronics unit. For example, the provision of two identical ramp arrangements disposed either side of a potted electronics component may be advantageous where there is expected a large temperature induced gap during operation use of the electronics unit.

The electronics unit may be a safe arm unit for a missile.

According to another aspect of the invention there is provided an electronic unit for a missile comprising a potted electronics in a housing; the unit being adapted to compensate for a difference in coefficient of thermal expansion between the potted electronics and the housing, the unit further comprising; a first ramp; and, a second ramp slidably arranged against the first ramp, wherein the first and second ramps are disposed within the housing, the first or the second ramp abutting the potted electronics so as to provide an interference fit between the potted electronics and the housing; wherein the first ramp and second ramp each comprise a coefficient of thermal expansion selected to maintain the interference fit between the potted electronics and the housing throughout a temperature range.

The invention extends to a missile comprising the electronics unit of the first aspect. The missile may comprise a plurality of electronics units as herein defined. The missile may be air launched, ground launched or sea launched.

FIGURES

Several arrangements of the invention will now be described by way of example and with reference to the accompanying drawings of which:

FIG. 2 shows a force diagram of the example arrangement of FIG. 1a.

Figure 1B:
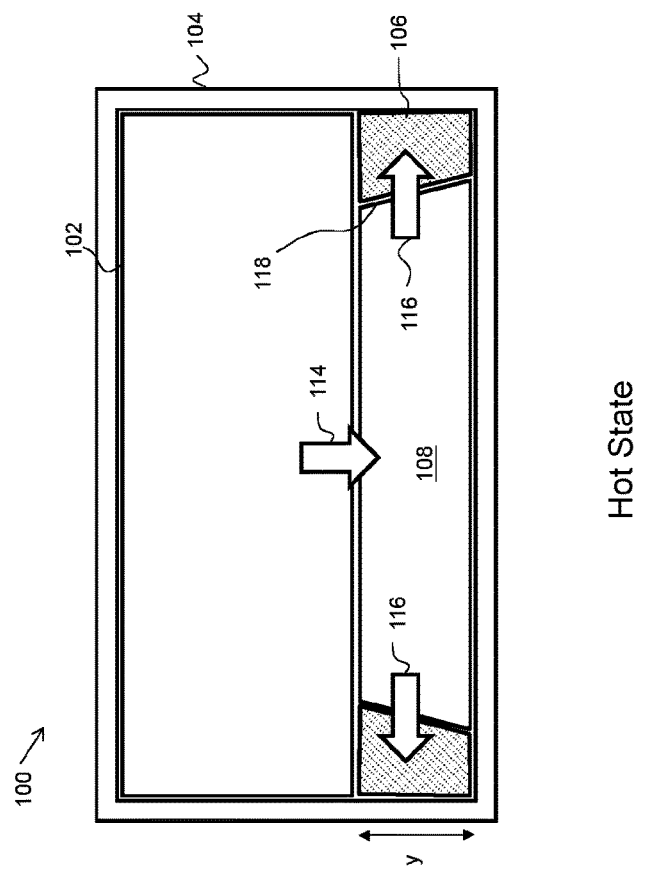
FIGS. 1a & 1b show an example arrangement of the device.
Figure 1A:
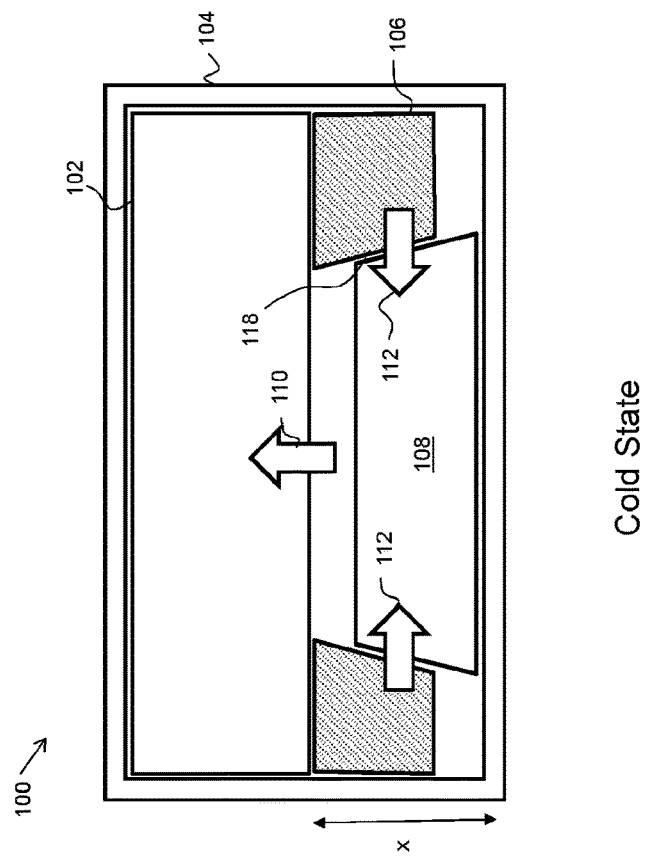

FIGS. 1a & 1b show an example of the electronics unit 100 according to an embodiment of the invention, respectively in a cold temperature and a hot temperature state. The unit 100 comprises a potted electronics 102 in a housing 104. The unit 100 is adapted to compensate for a difference in coefficient of thermal expansion between the potted electronics 102 and the housing 104, the unit further comprising a first ramp 106 and a second ramp 108 slidably arranged against the first ramp 106. The first and second ramps meet at an interface 118. Both the first and second ramps are disposed within the housing 104 wherein the first ramp 106 or the second ramp 108 abuts the potted electronics 102 so as to provide an interference fit between the potted electronics 102 and the housing 104. The first ramp 106 and second ramp 108 each comprise a coefficient of thermal expansion selected to maintain the interference fit between the potted electronics and the housing throughout a temperature range.

An axis of the unit 100 can be defined as being in a direction to or from the potted electronics to the ramp arrangement. The axis is aligned with the direction indicated by arrows 110 and 114 in FIGS. 1a and 1b. The interface between first and second ramps 106 and 108 is at an angle to this axis. In the present example the angle is approximately 30° to the axis in the direction from the potted electronics to the ramp arrangement.

In the present arrangement, the electronics are potted in Eccobond 45™ to form the potted electronics 102. The housing is an aluminium housing in the form of a hollow cylindrical container. As the housing 104 comprises a coefficient of thermal expansion lesser than the potted electronics 102, there is a mismatch in CTE, and the housing 104 expands to a lesser extent than the potted electronics 102.

In the present arrangement, the first ramp 106 is a toroid concentrically mounted on the second ramp 108 which is a cone. The first ramp 106 is made from acetal having a CTE of $120 \times 10^{-6}$ m/mK. The second ramp 108 is made from aluminium 2014A having a CTE of $23 \times 10^{-6}$ m/mK. In this example, the first ramp comprises a CTE greater than the second ramp, and so the first ramp will expand or contract to a greater extent than the second ramp.

Whilst in this example the first ramp 106 is made from acetal and the second ramp 108 is made from aluminium 2014A, it may be appreciated that the exact material selection of the first ramp 106 and second ramp 108 may be selected according to the maximum and minimum axial length of an expected temperature induced gap. As such, the first and second ramp may be made from a group of materials comprising metal, metal alloys, metalloids, polymers such as nylon, isoprene, polypropelene, polyoxymethylene (Delrin®) or hydroxyacetone (acetal). Preferably, the first ramp is made from a polymer. More preferably, the first ramp is made from polyoxymethylene (Delrin®). Preferably, the second ramp is made from aluminium. More preferably, the second ramp is made from aluminium 2014A.

As the temperature cools, the potted electronics 102 contracts thereby vacating a volume to create a temperature induced gap indicated by arrow 110 in FIG. 1a. The first ramp 106 contracts more than the second ramp 108 as indicated by arrows 112. As the first ramp 106 contracts, it exerts a compressive force on the second ramp 108, which is resolved into a linear force by sliding against the second ramp 108. It can be seen that the axial length of the ramp arrangement is extended. Because the ramp arrangement is constrained by the walls of the housing, the ramp arrangement pushes into the temperature induced gap vacated by the potted electronics 102. The ramp arrangement thus exerts a securing force against the potted electronics 102, preventing vibration and unwanted movement of the potted electronics 102 within the housing 104 and maintaining an interference fit between the potted electronics 102 and housing 104.

Conversely, as the temperature increases, the first ramp 106 expands more than the second ramp 108 as indicated by arrows 116. The compression of the first ramp on the cone of the second ramp 108 is released. As the potted electronics expand to push against the ramp arrangement, the first ramp 106 therefore slides against the second ramp 108, reducing the axial length of the ramp arrangement. The ramp arrangement remains constrained by the walls of the housing, and continues to maintain the interference fit between the potted electronics 102 and the housing 104.

It can therefore readily be seen that the ramp arrangement (first ramp 106 and second ramp 108) changes its axial length in a cold temperature state indicated by distance x in FIG. 1a versus the axial length in a hot temperature state indicated by distance y in FIG. 1b.

Figure 2:
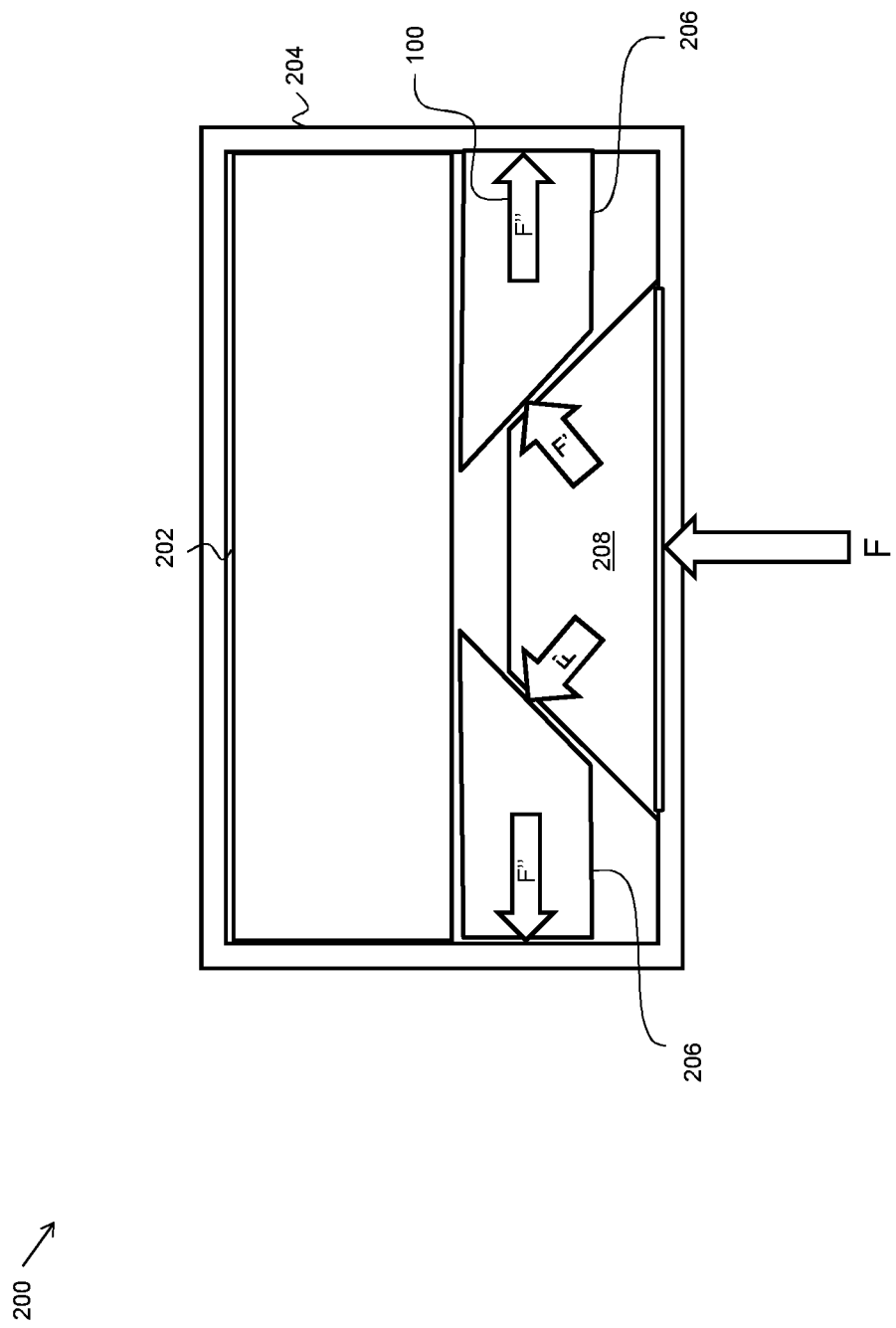

Turning to FIG. 2, there is provided a force diagram of an electronics unit 200 undergoing a high acceleration event indicated by Force F. In this arrangement, the electronics unit 200 oriented within the missile (not shown) such that the axis of roll of the missile is collinear with force vector F. In this arrangement, the second ramp 208 is integral to the housing 204, i.e. it is machined from a single body. In this arrangement, the interface between the first ramp 206 and second ramp 208, i.e. the ramp angle profile is linear and at 45°.

In this example, Force F is a force resulting from impact of the missile onto a target. Force F is directly transmitted through the housing 204 to the second ramp 208 as they are integral. The second ramp 208 is slidably mounted against the first ramp 206 therefore the Force F is translated through 45° defined by the ramp angle profile (45°) to become Force F'. The first ramp 206 is also abutted against the housing 204 therefore Force F' is further translated through another 45° into Force F". Force F" in turn acts against the side walls of the housing 204. Incoming Force F is therefore translated through 90° thereby converting the incoming impact force from a wholly axial force vector into a wholly lateral force. Force F is therefore not transmitted into the potted electronics 202. The arrangement thereby protects said electronics from damage.

Figure 3:
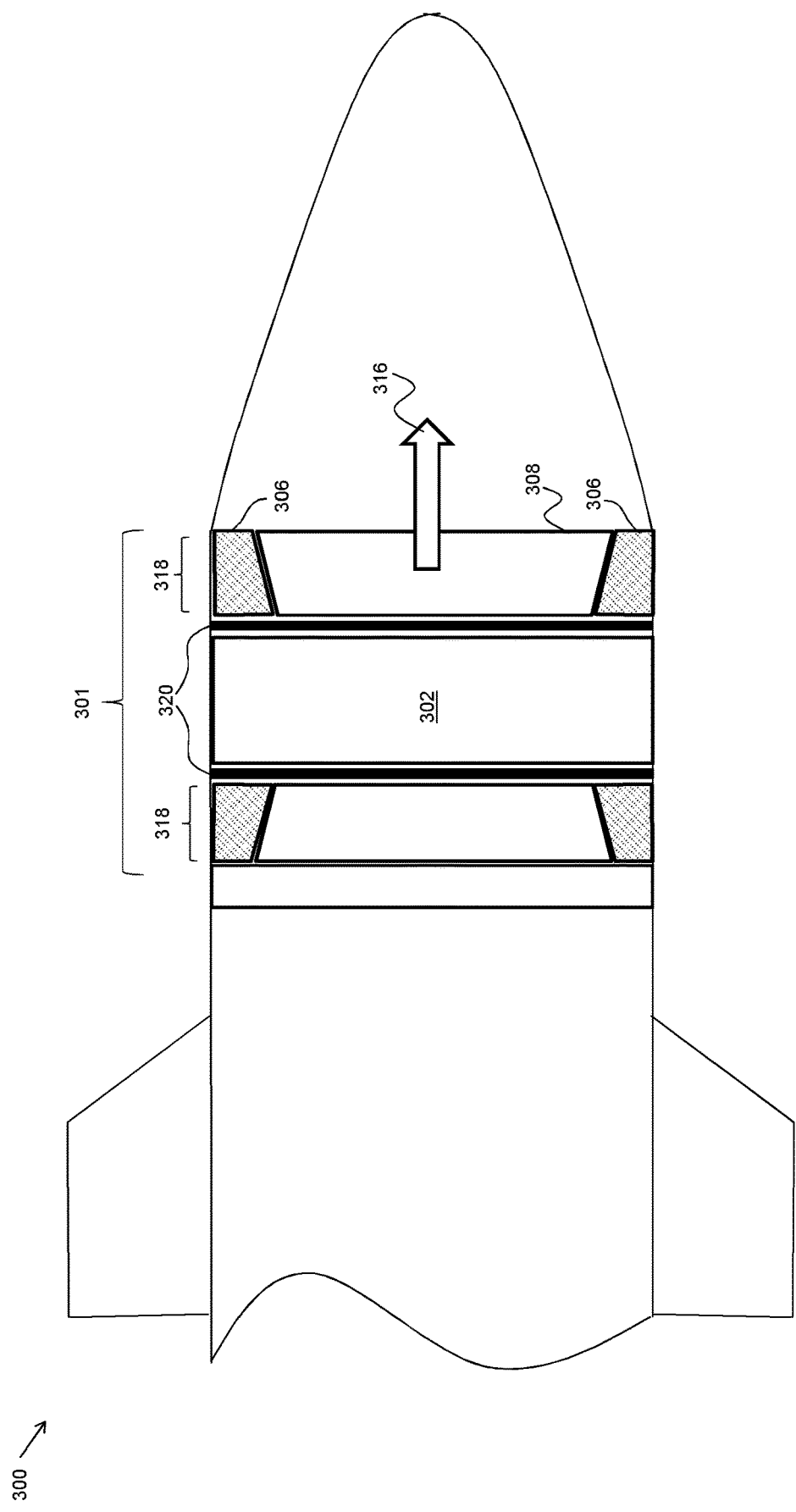
FIG. 3 shows a missile comprising the device.

Turning to FIG. 3, there is provided a missile 300 comprising an electronics unit 301, the electronics unit further comprising a housing (not shown) wherein the housing contains the potted electronics 302. The potted electronics 302 is held in an interference fit with the housing by two ramp arrangements 318 disposed either side of the potted electronics component 302. Each ramp arrangement comprises a first ramp 306 and a second ramp 308 slidably arranged against the first ramp 306. In this example, it will be seen that an axis can be defined in the direction from the electronics unit to either of the ramp arrangements 318. The axis is schematically indicated in FIG. 3 by arrow 316. It will also be seen that, in this example, the axis aligns with the roll axis of the missile. The electronics unit 301 further comprises a compressible membrane 320 disposed either side of the electronics component between the ramp arrangement 318 and the potted electronics unit 302. In this arrangement, the compressible membrane 320 is in the form of a rubber disc in order to further aide in the isolation of the potted electronics 302 within the housing. In this arrangement, the electronics unit 301 is a safe arm unit for the missile 300.

Whilst a number of specific embodiments have been described in the above, it will of course be appreciated that variations and modifications to those embodiments are possible. For example, whilst it in the above an embodiment has been described in which the axis of the unit aligns with the roll axis of a missile, it will be appreciated that other orientations of the unit within a missile will be possible. In particular it will be appreciated that in general missile designs are subject to space constraints, and the orientation of the unit may need to be selected so as to fit with such space constraints.

The invention claimed is:

1. An electronics unit for a missile comprising a potted electronics in a housing, the unit being adapted to compensate for a difference in coefficient of thermal expansion between the potted electronics and the housing;

the unit comprising a ramp arrangement disposed within the housing, and the unit having an axis in the direction from the potted electronics to the ramp arrangement;

the ramp arrangement comprising a first ramp, and a second ramp slidably arranged against the first ramp at a ramp interface, which ramp interface is angled relative to the axis;

the first and second ramps being formed of different materials having different coefficients of thermal expansion;

wherein the ramp arrangement abuts the potted electronics so as to provide an interference fit between the potted electronics and the housing, and is at least partially bounded by the housing such that, when the temperature changes and the different materials expand or contract by different amounts, the first and second ramps are constrained to move axially relative to one another within the housing so as to maintain the interference fit between the potted electronics and the housing; and wherein the materials of the first and second ramps are selected such that, when the temperature changes by an expected amount, the relative movement of the first and second ramps, is substantially equal in magnitude, and opposite in direction, to the size of a change in the axial length of the potted electronics in the housing, thereby maintaining the interference fit between the potted electronics and the housing.

2. The unit of claim 1 wherein the axis aligns with the roll axis of the missile and said ramp interface is configured to translate shocks along the roll axis of the missile through the angle into the housing thereby isolating the potted electronics.

3. The unit of claim 1 wherein the first ramp is a toroid and the second ramp is cone shaped.

4. The unit of claim 3 wherein the first and second ramp are concentrically arranged such that the toroid is slidably mounted on the cone.

5. The unit of claim 1 wherein the temperature range is in the range of from −60° C. to 100° C.

6. The unit of claim 1 wherein one of the first or second ramps is integral to the housing.

7. The unit of claim 1 wherein the potted electronics is potted in an epoxy compound.

8. The unit of claim 1 wherein the first ramp is made from a polymer.

9. The unit of claim 1 wherein the first ramp is made from polyoxymethylene.

10. The unit of claim 1 wherein the second ramp is made from aluminium.

11. The unit of claim 1 wherein the first or second ramp angle profile is tailored to ensure abutment of the first or second ramp to the potted electronics throughout the temperature range.

12. The unit of claim 1 wherein the unit further comprises a compressible membrane arranged between the first or second ramp and the potted electronics.

13. The unit of claim 1 wherein the first ramp comprises a coefficient of thermal expansion in the range of from 75 to $130 \times 10^{-6}$ m/mK.

14. The unit of claim 1 wherein the second ramp comprises a coefficient of thermal expansion in the range of from 10 to $30 \times 10^{-6}$ m/mK.

15. The unit of claim 1 wherein the unit is a safe arm unit for a missile.

16. A missile comprising the unit of claim 1.

* * * * *